United States Patent
Zheng et al.

(10) Patent No.: US 12,550,726 B2
(45) Date of Patent: Feb. 10, 2026

(54) PACKAGE CHIP HAVING A HEAT SINK AND METHOD FOR MANUFACTURING PACKAGE CHIP

(71) Applicant: Huawei Technologies Co., Ltd., Shenzhen (CN)

(72) Inventors: Jiantao Zheng, Shenzhen (CN); Nan Zhao, Shenzhen (CN); Shanghsuan Chiang, Shenzhen (CN); Xiao Hu, Shenzhen (CN); Junlei Tao, Shenzhen (CN); Yu Jiang, Beijing (CN); Jianbiao Lu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1039 days.

(21) Appl. No.: 17/489,403

(22) Filed: Sep. 29, 2021

(65) Prior Publication Data

US 2022/0020659 A1    Jan. 20, 2022

Related U.S. Application Data

(63) Continuation of application No. PCT/CN2019/080673, filed on Mar. 29, 2019.

(51) Int. Cl.
*H01L 23/367* (2006.01)
*H01L 23/053* (2006.01)
(Continued)

(52) U.S. Cl.
CPC .......... *H01L 23/367* (2013.01); *H01L 23/053* (2013.01); *H01L 23/3121* (2013.01);
(Continued)

(58) Field of Classification Search
CPC ....... H01L 21/52; H01L 23/053; H01L 23/10; H01L 23/367; H01L 2924/163; H01L 23/3121; H01L 23/3736; H01L 23/3737
See application file for complete search history.

(56) References Cited

U.S. PATENT DOCUMENTS 5,587,882 A    12/1996  Patel
7,268,428 B2 *  9/2007  Edwards ................. H01L 23/10
                                                    257/E23.087
(Continued)

FOREIGN PATENT DOCUMENTS

CN    101556940 A    10/2009
CN    101989585 A     3/2011
CN    108511404 A     9/2018

*Primary Examiner* — Dale E Page
*Assistant Examiner* — Abbigale A Boyle
(74) *Attorney, Agent, or Firm* — Leydig, Voit & Mayer, Ltd.

(57) ABSTRACT

A packaged chip and a method for manufacturing the packaged chip are provided. The packaged chip includes a substrate, a chip, and a heat sink. The heat sink includes a first bracket, a second bracket, and a cover. The first bracket and the second bracket are disposed on the substrate. The cover is supported on the substrate by the first bracket and the second bracket. The first bracket is a sealed annular bracket. The first bracket and the cover encircle a first space. The chip is accommodated in the first space. A thermal interface material is disposed between the chip and the cover. A hole connected to the first space is provided on the cover. The hole and the first space are filled with a filling material. The second bracket is located outside the first space.

8 Claims, 11 Drawing Sheets

(51) Int. Cl.
*H01L 23/31* (2006.01)
*H01L 21/52* (2006.01)
*H01L 23/373* (2006.01)

(52) U.S. Cl.
CPC .......... *H01L 21/52* (2013.01); *H01L 23/3736* (2013.01); *H01L 23/3737* (2013.01)

(56) References Cited

U.S. PATENT DOCUMENTS

| | | | |
|---|---|---|---|
| 7,659,554 B2 * | 2/2010 | Andoh | H01J 29/86 |
| | | | 257/E23.128 |
| 8,232,636 B2 | 7/2012 | Humenik et al. | |
| 8,970,029 B2 * | 3/2015 | Lin | H01L 23/427 |
| | | | 361/70 |
| 9,768,149 B2 * | 9/2017 | Vadhavkar | H01L 23/3157 |
| 10,134,654 B2 * | 11/2018 | Hartung | H01L 23/24 |
| 2004/0036183 A1 * | 2/2004 | Im | H01L 23/42 |
| | | | 257/796 |
| 2009/0219698 A1 * | 9/2009 | Chao | H01L 25/0655 |
| | | | 165/185 |
| 2011/0180923 A1 | 7/2011 | Humenik et al. | |
| 2014/0196878 A1 * | 7/2014 | Holman, IV | H05K 3/0061 |
| | | | 165/185 |
| 2015/0170990 A1 | 6/2015 | Tseng et al. | |

* cited by examiner

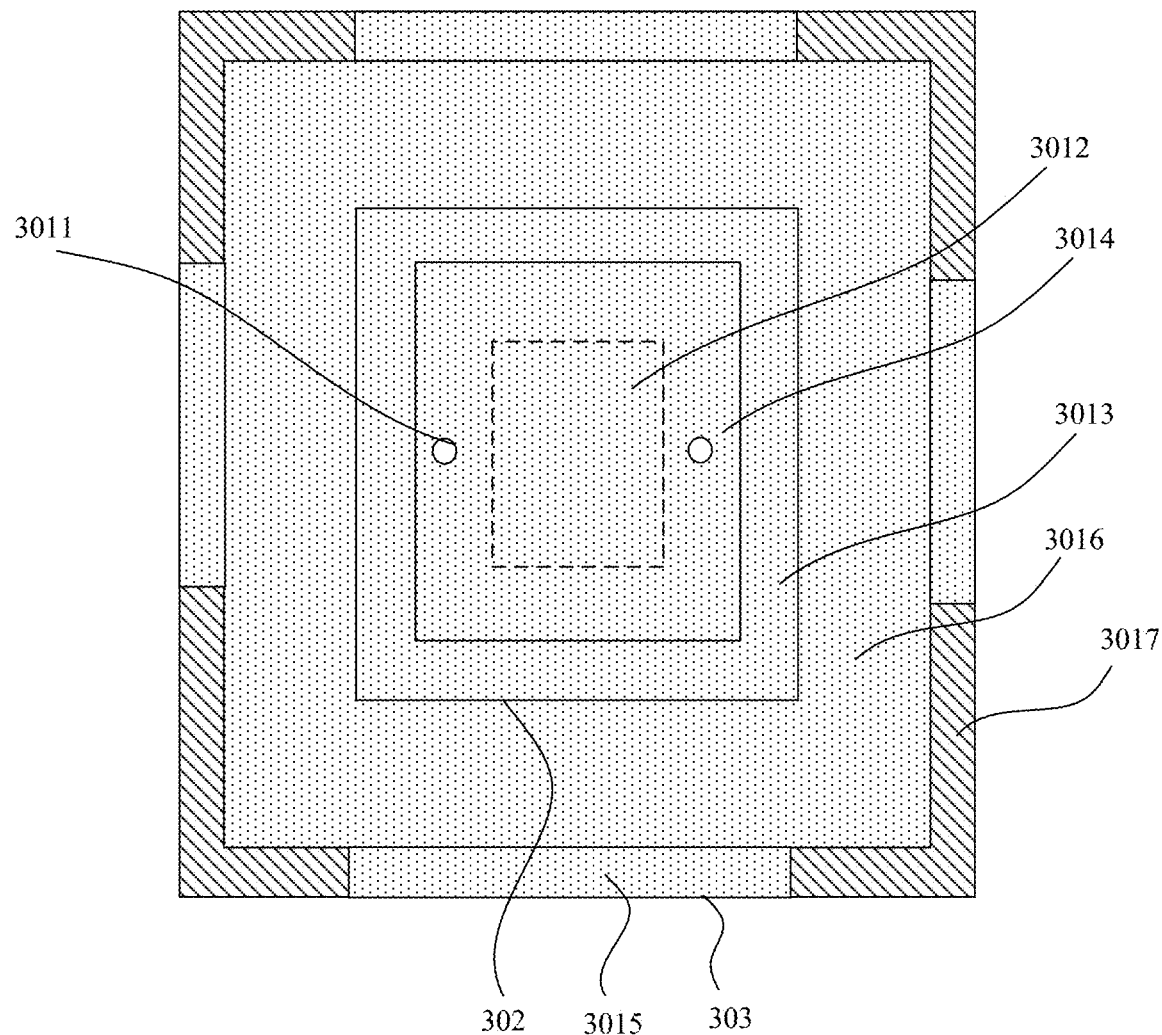
FIG. 4 (Amended)

PACKAGE CHIP HAVING A HEAT SINK AND METHOD FOR MANUFACTURING PACKAGE CHIP

CROSS-REFERENCE TO RELATED APPLICATIONS

This application is a continuation of International Application No. PCT/CN2019/080673, filed on Mar. 29, 2019, the disclosure of which is hereby incorporated by reference in its entirety.

TECHNICAL FIELD

Embodiments of this application relate to the field of electronic packaging technologies, and in particular, to a packaged chip and a method for manufacturing a packaged chip.

BACKGROUND

With development of microelectronic technologies, an integration degree of electronic chips is increasing, and power consumption of each electronic chip also becomes increasingly high. Therefore, heat flux density on an electronic chip such as a central processing unit (CPU for short) in a computer also becomes increasingly high.

To improve heat dissipation performance of a chip, an integrated heat sink may be bonded to the chip, and a thermal interface material (TIM for short) is disposed between the chip and the integrated heat sink.

The TIM is a general term for a material used for coating between a heat sink and a heating device to reduce thermal resistance on a contact interface between the heat sink and the heating device. This is because all surfaces have roughness. Therefore, when two surfaces are in contact with each other, the two surfaces cannot be completely in contact with each other, and there are always some air gaps between the two surfaces. In addition, a coefficient of thermal conductivity of air is quite small, thereby resulting in relatively large contact thermal resistance. However, the TIM can be used to fill the air gaps, so that the contact thermal resistance can be reduced, and heat dissipation performance can be improved.

A packaged chip in the conventional technology usually includes a substrate, and a chip and an integrated heat sink that are disposed on the substrate. The integrated heat sink includes a bracket supported on the substrate and a cover disposed on the bracket. A layer of the TIM is disposed between the chip and the cover, to improve heat dissipation performance of the heat sink.

An existing TIM is usually made of metal indium. Because the substrate, the chip, and the cover are made of different materials, coefficients of thermal expansion are also different. The chip and the substrate are deformed at room temperature or operating temperature. When the deformation of the chip and the substrate is transferred to the TIM, edges and corners of the TIM are pulled and therefore deformed and delaminated, and the TIM even cracks. This seriously affects a heat-conducting property of the TIM, and reduces heat dissipation performance of the packaged chip.

SUMMARY

Embodiments of this application provide a packaged chip and a method for manufacturing a packaged chip, to address poor heat dissipation performance of an existing packaged chip.

To achieve the foregoing objective, the following technical solutions are used in the embodiments of this application.

According to a first aspect of the embodiments of this application, a packaged chip is provided, including a substrate, a chip, and a heat sink.

The heat sink includes a first bracket, a second bracket, and a cover. The first bracket and the second bracket are disposed on the substrate. The cover is supported on the substrate by the first bracket and the second bracket. The first bracket is a sealed annular bracket. The first bracket and the cover encircle a first space. The chip is accommodated in the first space. A thermal interface material is disposed between the chip and the cover. A hole connected to the first space is provided on the cover. The hole and the first space are filled with a filling material. The second bracket is located outside the first space.

In this embodiment of this application, the filling material is injected into the first space, so that the first space becomes a solid whole, and deformation of the chip and the substrate can be limited, thereby avoiding cracking of the TIM or loss of the TIM due to heat. Therefore, the cover can be fully in contact with the chip, so that heat generated during operating of the chip is transferred to an external environment in a timely manner by using the cover, thereby improving heat dissipation performance of the packaged chip.

In addition, the heat sink in this embodiment of this application includes two brackets. Compared with disposing only one bracket, this can better press the substrate on a circuit board, thereby avoiding solder warpage when the substrate is soldered to the circuit board.

In addition, in this application, the filling material needs to be injected only into the first space encircled by the first bracket, thereby reducing a quantity of filling materials to be used.

In an optional implementation, the first bracket and the second bracket are integrally molded with the cover, and the first bracket and the second bracket are separately connected to the substrate by using a bonding material.

In an optional implementation, first ends of the first bracket and the second bracket are separately connected to the substrate by using a bonding material, and second ends of the first bracket and the second bracket are separately connected to the cover by using a bonding material.

A manner of connecting the cover to the first bracket and the second bracket is not limited in this application, and a person skilled in the art may select a manner as required.

In an optional implementation, the second bracket is an annular bracket disposed around the first bracket and the chip, and an opening is provided on the second bracket or on a bonding material between the second bracket and the substrate.

In this way, the second bracket is disposed as an annular bracket, so that the substrate can be better pressed on a circuit board, thereby avoiding solder warpage when the substrate is soldered to the circuit board.

In an optional implementation, the second bracket includes two or more support parts, and the support parts are evenly arranged on the substrate outside the first space.

In an optional implementation, materials of the TIM and the filling material are the same. The materials of the TIM and the filling material are both silicone gel, or the materials of the TIM and the filling material are both polyolefin resin. The TIM and the filling material are integrally molded through injection molding.

In this way, a filling operation for the filling material can be simplified, thereby improving working efficiency.

In an optional implementation, the cover includes a first cover opposite to the chip, a second cover opposite to the first bracket, and a third cover located between the first cover and the second cover, the hole is located on the first cover or the third cover, and the filling material is injected into the first space through the hole.

In this way, in the packaged chip of this application, after the filling material is injected into the first space through the hole and the filling material is cured, the hole is also sealed as a whole, and an interior of the entire packaged chip is a solid structure and is completely isolated from the external environment. This can prevent the internal structure of the packaged chip from being eroded by impurities in the air, thereby improving electrical performance and heat dissipation performance of the packaged chip.

In an optional implementation, materials of the TIM and the filling material are different. A material of the TIM is indium, and a material of the filling material is silicone gel or polyolefin resin. The filling material is molded through injection molding after the TIM is molded.

A conductive metal material may be selected for the TIM, and an insulating material may be selected for the filling material. In this way, a person skilled in the art may separately determine the materials of the TIM and the filling material as required, thereby providing more choices.

In an optional implementation, the cover includes a first cover opposite to the chip, a second cover opposite to the first bracket, and a third cover located between the first cover and the second cover, the hole is located on the third cover, and the filling material is injected into the first space through the hole.

In this way, the hole can be kept away from a location of the pre-molded TIM, so that the filling material can be injected directly into the first space.

A specific location, a size, and a quantity of holes are not limited in this application.

According to a second aspect of the embodiments of this application, a method for manufacturing a packaged chip is provided. A material of the TIM is indium, and a material of the filling material is silicone gel or polyolefin resin. The method includes: fixing a chip to a first surface of a substrate; placing the TIM on a surface, of the chip, that is away from the substrate, and applying a bonding agent to the first surface of the substrate; separately connecting first ends of the first bracket and the second bracket to the bonding agent, where second ends of the first bracket and the second bracket are connected to a cover, the cover is in contact with the TIM, the first bracket surrounds the chip, the second bracket surrounds the first bracket, the first surface of the substrate, the cover, and the first bracket jointly encircle a first space, a hole is provided on the cover of the first space, and the cover is integrally molded with the first bracket and the second bracket, or the cover is connected to the first bracket and the second bracket by using the bonding agent; performing heating to melt the TIM, so that the TIM seals a gap between the chip and the cover; curing the TIM, so that the chip is connected to the cover by using the cured TIM, and curing the bonding agent to form a bonding rubber ring; injecting the filling material through the hole to fill the first space; and curing the filling material.

According to a third aspect of the embodiments of this application, a method for manufacturing a packaged chip is provided. Materials of the TIM and the filling material are both silicone gel, or the materials of the TIM and the filling material are both polyolefin resin. The method includes: fixing a chip to a first surface of a substrate; applying two circles of bonding agent to the first surface of the substrate; separately connecting first ends of the first bracket and the second bracket to the bonding agent, where second ends of the first bracket and the second bracket are connected to a cover, the cover is in contact with the TIM, the first bracket surrounds the chip, the second bracket surrounds the first bracket, the first surface of the substrate, the cover, and the first bracket jointly encircle a first space, a hole is provided on the cover of the first space, and the cover is integrally molded with the first bracket and the second bracket, or the cover is connected to the first bracket and the second bracket by using the bonding agent; curing the bonding agent to form a bonding rubber ring; injecting the filling material through the hole to fill the first space; and curing the filling material.

These aspects or other aspects of this application are clearer and easier to understand in descriptions of the following embodiments.

BRIEF DESCRIPTION OF DRAWINGS

FIG. 4 is a top view of another packaged chip according to an embodiment of this application;

DESCRIPTION OF EMBODIMENTS

To make objectives, technical solutions, and advantages of this application clearer, the following further describes this application in detail with reference to accompanying drawings.

The following terms "first", "second" and the like are merely intended for a purpose of description, and shall not be understood as an indication or implication of relative importance or implicit indication of the number of indicated technical features. Therefore, a feature limited by "first", "second" or the like may explicitly or implicitly include one or more features. In the description of this application, unless otherwise stated, "a plurality of" means two or more than two.

In addition, in this application, orientation terms such as "up" and "down" are defined relative to placement orientations of components shown in the accompanying drawings.

It should be understood that these directional terms are relative concepts and are used for relative descriptions and clarifications, and may vary accordingly based on changes of the placement orientations of the components in the accompanying drawings.

Figure 1:
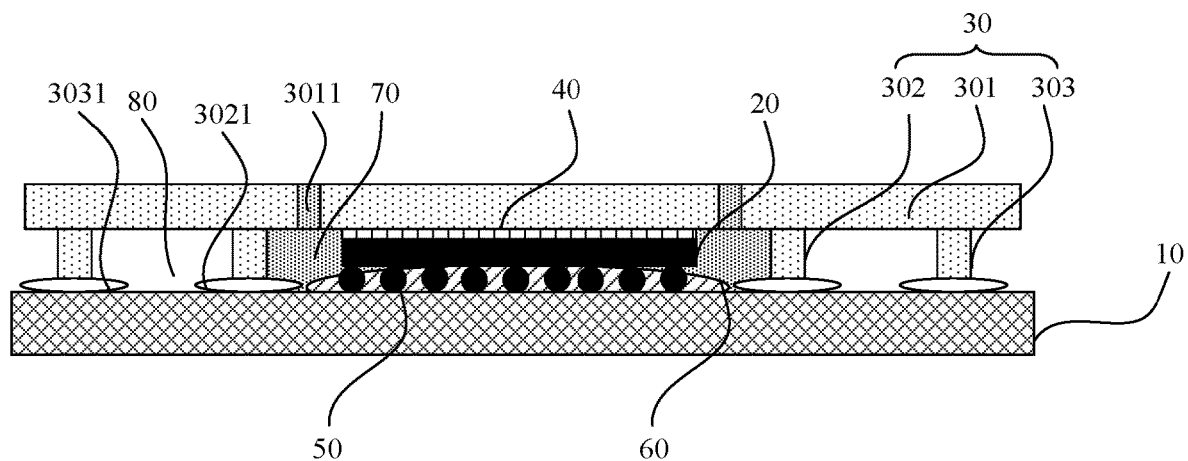
FIG. 1 is a sectional view of a packaged chip according to an embodiment of this application.

The following describes a packaged chip provided in the embodiments of this application with reference to the accompanying drawings. FIG. 1 is a sectional view of a packaged chip according to an embodiment of this application. As shown in FIG. 1, the packaged chip includes a substrate 10, a chip 20, and a heat sink 30. The chip 20 is located on a surface of the substrate 10, and is electrically connected to the substrate 10. The heat sink 30 and a first surface of the substrate 10 encircle a sealed space. The chip 20 is located in the sealed space. The heat sink 30 may be configured to protect the chip 20, and may be further configured to dissipate heat for the chip 20.

Figure 2:
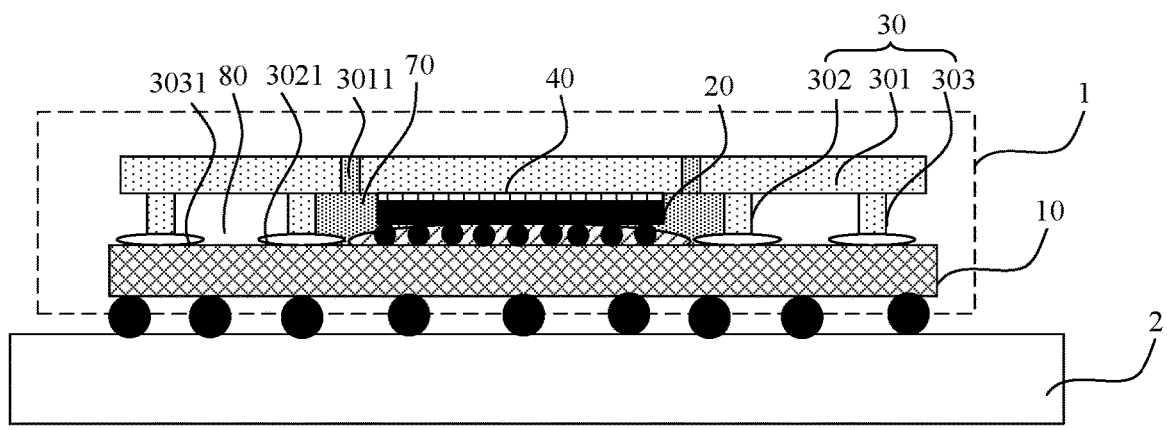
FIG. 2 is a diagram of a use status of a packaged chip according to an embodiment of this application.

FIG. 2 is a diagram of a use status of the packaged chip. As shown in FIG. 2, the packaged chip 1 is disposed on a circuit board 2 during use. For example, the circuit board 2 is configured to carry the packaged chip. The packaged chip 1 is fixed on the circuit board 2, and is electrically connected to the circuit board 2. The circuit board 2 may be a common printed circuit board.

Still refer to FIG. 1 and FIG. 2. The substrate 10 and the circuit board 2 each include a first surface and a second surface that are opposite to each other, and a second surface of the substrate 10 is opposite to a first surface of the circuit board.

When the substrate 10 is specifically disposed, for example, the substrate 10 is located on the first surface of the circuit board 2, and the substrate 10 is fastened to the circuit board 2 by using a solder ball. It should be understood that soldering between the substrate 10 and the circuit board 2 shown in FIG. 1 is merely a specific implementation, and another connection manner may be alternatively used for connection in this embodiment of this application. In addition, for the substrate 10, substrates 10 made of different materials, for example, silicon, ceramic, and organic substrates 10, may be used.

For example, the chip 20 may be a bare die, or may be a packaged structure in which a bare die is packaged. When the chip 20 is specifically disposed, for example, the chip 20 is located on the first surface of the substrate 10, and the chip 20 includes a first surface and a second surface that are opposite to each other, and a side surface that connects the first surface and the second surface. When the chip 20 is connected to the substrate 10, the second surface of the chip 20 is opposite to the first surface of the substrate 10. When the chip 20 is connected to a circuit layer of the substrate 10, for example, a solder ball 50 may be used for connection, or a jumper may be used for connection. Any manner may be used provided that an electrical connection can be implemented.

When the solder ball 50 is used for connection, for example, a filling material 60 may be further injected into a gap between solder balls 50. A material of the filling material 60 may be specifically one or more of silicone gel, polyolefin resin, epoxy resin, modified epoxy resin, silicone resin, and modified silicone resin.

The chip 20 generates heat during use. To transfer the heat generated by the chip 20 to an external environment for heat dissipation, for example, a heat sink 30 is further disposed to cover the chip 20.

When the heat sink 30 is specifically disposed, for example, the heat sink 30 includes brackets (302 and 303) disposed on the first surface of the substrate 10, and a cover 301 that covers the brackets. For example, the brackets (302 and 303) are fastened to the substrate 10. A specific fastening manner may be a soldering, bonding, or clamping connection, or a connection by using a connector (such as a bolt or a screw).

Figure 3:
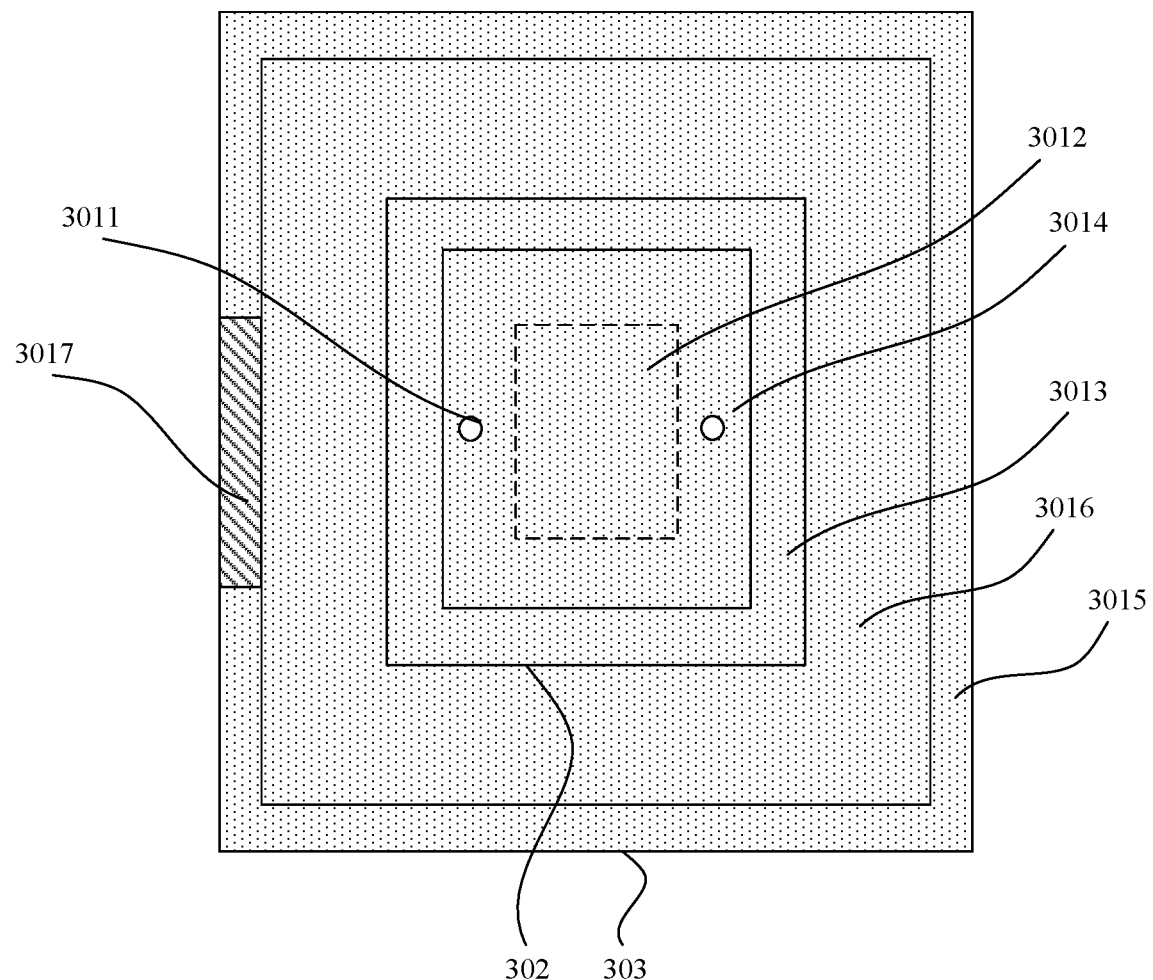
FIG. 3 is a top view of a packaged chip according to an embodiment of this application.

Refer to FIG. 3 and FIG. 4. A cross section of the cover 301 in this application is rectangular. Certainly, if the objective of this application can be achieved, the cross section of the cover 301 is not limited to the rectangular shape, and the cross section may be alternatively in a circular shape, a trapezoidal shape, or another shape. In this embodiment of this application, a shape of the cover 301 is the same as that of the substrate 10.

Currently, as the existing chip 20 becomes increasingly large, the substrate 10 configured to carry the chip 20 also becomes larger, and a size of the cover 301 of the heat sink 30 also adaptively becomes larger. As a result, when the substrate 10 is soldered to the circuit board 2, the substrate 10 is deformed due to thermal expansion. The heat sink 30 has relatively high strength and therefore can tightly press against the substrate to prevent the substrate from being deformed. However, the existing heat sink usually has only one layer of bracket disposed along a periphery of the substrate 10, and can press against the periphery of the substrate only by using the bracket. Relatively large deformation is likely to occur at a location close to a center of the substrate 10. As a result, the center of the substrate 10 is bent in a direction toward or away from the cover 301 of the heat sink, thereby causing solder warpage, and affecting stability of the packaged chip.

Therefore, an embodiment of this application provides a packaged chip with a dual-bracket structure. FIG. 3 is a top view of a packaged chip according to an embodiment of this application. The top view is a drawing obtained by viewing the structure of the packaged chip shown in FIG. 1 from the top down. For ease of description, a perspective method is used in the figure to show an outline of a bracket. As shown in FIG. 3, there may be two brackets: a first bracket 302 and a second bracket 303. The first bracket 302 and the second bracket 303 are disposed on the first surface of the substrate 10. The cover 301 is supported on the substrate 10 by the first bracket 302 and the second bracket 303. For example, the first bracket 301 is a sealed annular bracket, and the first surface of the substrate 10, the cover 301, and the first bracket 302 jointly encircle a first space 70. The chip 20 is accommodated in the first space 70. This prevents electrical performance of the chip 20 from deteriorating due to corrosion of a circuit of the chip 20 caused by impurities in outside air.

The second bracket 303 is located outside the first space. When the second bracket 303 is specifically disposed, as shown in FIG. 3, in an embodiment of this application, the second bracket 303 may be disposed as an annular bracket that surrounds the first bracket 302 and the chip 20, and the second bracket 303 is disposed along a periphery of the substrate 10.

In this way, two brackets are disposed. Compared with disposing only one bracket, this increases a contact area between the brackets and the substrate. Therefore, when the substrate tends to be bent due to heat, the substrate can be better pressed on the circuit board, thereby avoiding solder warpage when the substrate is soldered to the circuit board.

The first bracket 302, the second bracket 303, the cover 301, and the first surface of the substrate 10 jointly encircle a second space 80. To prevent air in the second space 80 from expanding or contracting with temperature changes to affect performance of the packaged chip when the substrate 10 is soldered to the circuit board 2, for example, an opening 3017 may be provided on the second bracket 303 or on a bonding material between the second bracket 303 and the substrate 10.

In another embodiment of this application, the second bracket 303 may include two or more support parts. FIG. 4 is a top view of another packaged chip according to an embodiment of this application. As shown in FIG. 4, the second bracket 303 includes four support parts. For example, the support parts are evenly arranged along the periphery of the substrate 10.

In addition, when the first bracket 302 and the second bracket 303 are specifically disposed, for example, the second bracket 303 may be disposed along a periphery of the first surface of the substrate 10, and the first bracket 302 may be disposed at a location between the second bracket 303 and the chip 20. In this way, when the substrate 10 is soldered to the circuit board 2 and the substrate 10 tends to be deformed due to thermal expansion, the second bracket can press against the periphery of the substrate 10, the first bracket 302 can press against the substrate 10 around the chip 20, and force can be evenly applied to the first bracket 302 and the second bracket 303 to evenly press the substrate 10 on the circuit board, so that the substrate 10 cannot be bent.

In this embodiment of this application, the heat sink 30 is provided with two brackets: 302 and 303. Compared with a heat sink provided with only one bracket, the heat sink 30 can better press the substrate 10 on the circuit board, thereby avoiding solder warpage when the substrate 10 is soldered to the circuit board 2.

If only the first bracket 302 is used for the heat sink 30, because a size of the chip is usually smaller than that of the substrate, a size of the heat sink needs to be selected. Assuming that an plan view size of the cover of the heat sink 30 is similar to that of the substrate, to maintain a balance of the heat sink, a location of the first bracket 302 is also close to an edge of the substrate 10. In this case, relatively large deformation is likely to occur at a location close to the center of the substrate 10. As a result, the center of the substrate 10 is bent in a direction toward or away from the cover 301 of the heat sink, thereby causing solder warpage. However, if the size of the heat sink 30 is small and the first bracket 302 is located close to the chip 20, heat generated by the chip is controlled by the heat sink 30 near the center of the substrate 10, and uneven heat distribution causes a new structural risk during use of the chip.

When the heat sink 30 is supported by using dual brackets such as the first bracket 302 and the second bracket 303, the foregoing problem can be avoided.

Further, in the packaged chip in this embodiment of this application, a filling material needs to be injected into the first space to avoid cracking of a thermal interface material. However, if a lateral area of the first space is quite large, the filling material is also subject to hot and cold impact in a horizontal direction after curing and is deformed. A larger lateral area naturally indicates larger deformation stress transferred to the middle. As a result, a thermal interface material at a central part or a periphery of the chip may be pulled and crack. However, in this application, a size of the filling material that needs to be injected can be controlled by using the design of the double-layer brackets, thereby avoiding a stress risk caused by the filling material.

A specific structure of the second bracket is not limited in this application, and a person skilled in the art may select structures as required. All these structures fall within the protection scope of this application.

For ease of description, the following embodiments of this application are all described by using an example in which the second bracket 303 is the annular bracket shown in FIG. 3.

For example, the cover 301, the first bracket 302, and the second bracket 303 may be made of a metal material such as copper, aluminum, or an alloy thereof. The cover 301, the first bracket 302, and the second bracket 303 are configured to dissipate heat for the chip 20.

To further improve heat dissipation performance of the packaged chip, for example, a TIM 40 may be further disposed between the chip 20 and the cover 301, to effectively transfer heat generated by the chip 20 to the outside.

Refer to FIG. 1. The TIM 40 is disposed between the chip 20 and the cover 301, so that contact thermal resistance between the chip 20 and the cover 301 can be reduced. This is because all surfaces have roughness. Therefore, when surfaces of the chip 20 and the cover 301 are in contact with each other, the surfaces cannot be completely in contact with each other, and there are always some air gaps between the surfaces. In addition, a coefficient of thermal conductivity of air is quite small, thereby resulting in relatively large contact thermal resistance. However, the TIM 40 can be used to fill the air gaps, so that the contact thermal resistance can be reduced, and heat dissipation performance can be improved.

For example, the TIM 40 includes a first surface and a second surface that are opposite to each other. For example, the first surface of the TIM 40 is adjacent to the cover 301, and the second surface of the TIM 40 is adjacent to the first surface of the chip 20.

In the packaged chip provided in this embodiment of this application, the TIM 40 is disposed between the cover 301 and the chip 20, so that the cover 301 can be fully in contact with the chip 20, to transfer heat generated during operating of the chip 20 to an external environment in a timely manner.

For example, a conductive thermal interface material such as indium or other low-melting-point metal may be used for the TIM 40, or an insulating thermal interface material such as silicone gel or polyolefin resin may be used for the TIM 40.

When the TIM 40 is specifically disposed, if indium is used for the TIM 40, for example, the TIM 40 may be placed on the first surface of the chip 20 first, and then the cover 301 is fixed above the TIM 40, and then the entire packaged structure is heated, so that the TIM 40 is melted, to fill the air gaps between the chip 20 and the cover 301.

However, the chip 20 is usually made of silicon, which is different from a material used for the cover 301, such as copper, aluminum, or an alloy thereof, and coefficients of thermal expansion are greatly different. If the TIM 40 is made of metal indium, the TIM 40 is in a solid state at room temperature or operating temperature. When thermo-mechanical stress generated due to different coefficients of thermal expansion of the chip 20 and the substrate 10 is transferred to the TIM 40, delamination occurs at edges and corners of the TIM 40, thereby affecting a heat-conducting property of the TIM 40. In addition, a melting point of the metal indium is relatively low and is approximately 156.61° C. After the chip 20 is packaged, the chip 20 needs to be further electrically connected to the circuit board. In this case, temperature needs to be increased to 220° C. As a result, the TIM 40 is melted, and is lost from a gap between the chip 20 and the heat sink 30, thereby affecting a heat-conducting property of the TIM 40.

To avoid cracking of the TIM 40 or loss of the TIM 40 due to heat, for example, the filling material may be injected into the first space 70 to limit deformation of the TIM 40. The chip 20 further includes a side surface that connects the first surface of the chip 20 and the second surface of the chip 20. The TIM 40 includes a side surface that connects the first surface of the TIM 40 and the second surface of the TIM 40. For example, the filling material may be disposed adjacent to the side surfaces of the chip 20 and the TIM 40.

To prevent the filling material from conducting the heat sink 30 and the like in the packaged chip to the substrate 10 to cause a short circuit of the packaged chip, an insulating material should be used for the filling material. A material of the filling material may be specifically one or more of silicone gel, polyolefin resin, epoxy resin, modified epoxy resin, silicone resin, and modified silicone resin.

When the filling material is filled into the first space 70, for example, the filling material should be melted first, and the liquid filling material should be injected into the first space 70, and then the filling material is cured or preliminarily cured. The cured filling material is disposed adjacent to the side surfaces of the chip 20 and the TIM 40, and the first space 70 becomes a whole with a solid structure, so that a connection between the substrate 10, the chip 20, and the cover 301 of the heat sink 30 is enhanced, deformation of the chip 20 and the substrate 10 is limited, and edges and corners of the TIM 40 are no longer delaminated.

In addition, in a process of electrically connecting the packaged chip to the circuit board, even if the TIM 40 in the packaged chip is melted again due to heat, flow of the liquid TIM 40 is also limited by the filling material, and the TIM 40 does not flow to another location to cause loss of the TIM 40 or a short circuit of another device.

If silicone gel or polyolefin resin is used for the TIM 40, for example, a material same as that of the TIM 40 may be used for the filling material. During filling, no TIM needs to be separately disposed, the first space may be directly filled with the filling material, and a filling material distributed between the cover 301 and the chip 20 serves as the TIM. After the filling material is cured, the cover 301 and the chip 20 may be bonded, so that the cover 301 and the chip 20 are more fully in contact with each other, to transfer heat generated during operating of the chip 20 to the outside in a timely manner. In addition, the first space, as a solid whole, can limit deformation of the chip and the substrate.

In this embodiment of this application, the filling material is injected into the first space, thereby avoiding cracking of the TIM or loss of the TIM due to heat. Therefore, the cover can be fully in contact with the chip, so that heat generated during operating of the chip is transferred to an external environment in a timely manner by using the cover.

In addition, in a packaged chip in the conventional technology, for example, an opening needs to be further provided on a connection structure between the heat sink 30 and the substrate. This is because air in a sealed space of the existing packaged chip expands or contracts with temperature changes, thereby affecting stability of the packaged chip. However, after packaging is completed, the opening still exists, and air in an external environment enters the sealed space through the opening, and erodes an internal structure of the packaged chip. As a result, an internal metal material, such as the metal indium material used for the TIM 40, is oxidized or vulcanized, thereby affecting electrical performance and heat dissipation performance of the packaged chip.

For this, in this embodiment of this application, when the filling material is injected into the first space, for example, several holes 3011 may be provided on the cover 301 first, the filling material is filled into the first space through the hole 3011, and original air in the sealed space is discharged through the hole 3011. In addition, in the packaged chip of this application, after the filling material is injected into the first space 70 through the hole 3011 and the filling material is cured, the hole 3011 is also sealed as a whole, and an interior of the entire packaged chip is a solid structure and is completely isolated from the external environment. This can prevent the internal structure of the packaged chip from being eroded by impurities in the air, thereby improving electrical performance and heat dissipation performance of the packaged chip.

When the hole 3011 is specifically provided, for example, the hole 3011 extends from an outer side of the cover 301 to an inner side of the cover 301, and penetrates the cover 301.

For example, the cover 301 includes a first cover 3012 facing the first surface of the TIM 40, a second cover 3013 facing the first bracket, a third cover 3014 located between the first cover 3012 and the second cover 3013, a fourth cover 3015 facing the second bracket, and a fifth cover 3016 located between the second cover 3013 and the fourth cover 3015.

When the hole is specifically provided, if different materials are used for the TIM 40 and the filling material and the TIM 40 is located in a gap between the cover 301 and the chip 20, when the filling material is injected into the first space 70, the filling material should be kept away from the TIM 40. Therefore, the hole 3011 may be located on the third cover 3014.

If a same material is used for the TIM 40 and the filling material, the filling material may be injected into the first space directly through the hole 3011, and a filling material distributed between the cover 301 and the chip 20 serves as the TIM. In this case, the hole 3011 may be at any location on the fourth cover 3015 and the first cover 3012.

For example, the hole 3011 includes an injection opening. For example, the filling material may be injected, through the injection opening, into the first space jointly encircled by the brackets, the cover 301, and the substrate 10, and distributed between the first bracket and the side surfaces of the chip 20 and the TIM 40. There may be a plurality of injection openings, and the plurality of injection openings may be evenly distributed on the third cover 3014. Based on this, the filling material may be evenly filled into the sealed space through the injection opening, so that the cover 301 is fully and evenly in contact with the chip 20, to transfer heat generated during operating of the chip 20 to the outside in a timely manner, thereby improving heat dissipation efficiency.

For example, the hole 3011 further includes a ventilation hole. After the filling material enters, through the injection opening, the sealed space jointly encircled by the brackets, the cover 301, and the substrate 10, original air in the sealed space can be discharged through the ventilation hole. There may be one or more ventilation holes, and the ventilation holes are all distributed on the third cover 3014.

Specific quantities of injection openings and ventilation holes are not limited in this application, and may be set by a person skilled in the art as required.

In this embodiment of this application, one injection opening and one ventilation hole are used as examples for description. Refer to FIG. 2. Both the injection opening and the ventilation hole are located on the third cover 3014. In an embodiment of this application, the injection opening and the ventilation hole may be located on opposite sides. In another embodiment of this application, for example, the injection opening and the ventilation hole may be provided at opposite corners of the cover 301. Alternatively, the injection opening and the ventilation hole may be provided adjacent to each other.

In addition, in this application, the filling material needs to be injected only into the first space, thereby reducing a quantity of filling materials to be used.

The following describes connection structures between the first bracket 302 and second bracket 303 and the substrate 10, and between the first bracket 302 and second bracket 303 and the cover 301.

In an implementation of this application, for example, the first bracket 302 and the second bracket 303 may be integrally molded with the cover 301, and the first bracket 302 and the second bracket 303 each include a second end connected to the cover 301 and a first end extending in a direction away from the cover 301. For example, a first end of the first bracket 302 may be connected to the first surface of the substrate 10 by using a first bonding rubber ring 3021, and a first end of the second bracket 303 may be connected to the first surface of the substrate 10 by using a second bonding rubber ring 3031.

The first bonding rubber ring is configured to seal the first space 70, and the second bonding rubber ring 3031 is configured to seal the second space 80.

For example, the first space 70 is a stable solid structure filled with the filling material inside, and the first bonding rubber ring 3021 configured to seal the first space 70 may be a complete annular structure.

The second space 80 is a hollow structure. To prevent air in the second space 80 from expanding or contracting with temperature changes to affect performance of the packaged chip, for example, an opening 3017 is provided on the second bonding rubber ring 3031 configured to seal the second space 80. The opening 3017 may be provided at any location on the second bonding rubber ring 3031. There may be one or more openings 3017. A person skilled in the art may determine a size and a location of the opening 3017 as required. This is not limited in this application.

When the first bonding rubber ring 3021 and the second bonding rubber ring 3031 are specifically disposed, for example, the first bonding rubber ring 3021 is located on a periphery of the chip 20, the second bonding rubber ring 3031 surrounds the first bonding rubber ring 3021, and the second bonding rubber ring 3031 is located on a periphery of the substrate 10. For example, the first bonding rubber ring 3021 and the second bonding rubber ring 3031 each include a first surface and a second surface that are opposite to each other. The first end of the first bracket 302 abuts against a first surface of the first bonding rubber ring 3021. The first end of the second bracket 303 abuts against a second surface of the second bonding rubber ring 3031.

For example, both the first bonding rubber ring 3021 and the second bonding rubber ring 3031 may be obtained by curing a bonding agent. For example, a specific connection process may be as follows: First, the bonding agent is applied to the first surface of the substrate 10; then the first bracket 302 and the second bracket 303 press against the bonding agent; and after the bonding agent is cured, the first bonding rubber ring 3021 connected to the first bracket 302 and the second bonding rubber ring 3031 connected to the second bracket 303 are separately formed.

Alternatively, the bonding agent may be applied to the first ends of the first bracket 302 and the second bracket 303 first. Then the bonding agent is attached to the first surface of the substrate 10 along with the brackets. After the bonding agent at the first ends of the first bracket 302 and the second bracket 303 is cured, the first bonding rubber ring 3021 and the second bonding rubber ring 3031 are separately formed.

Figure 5:
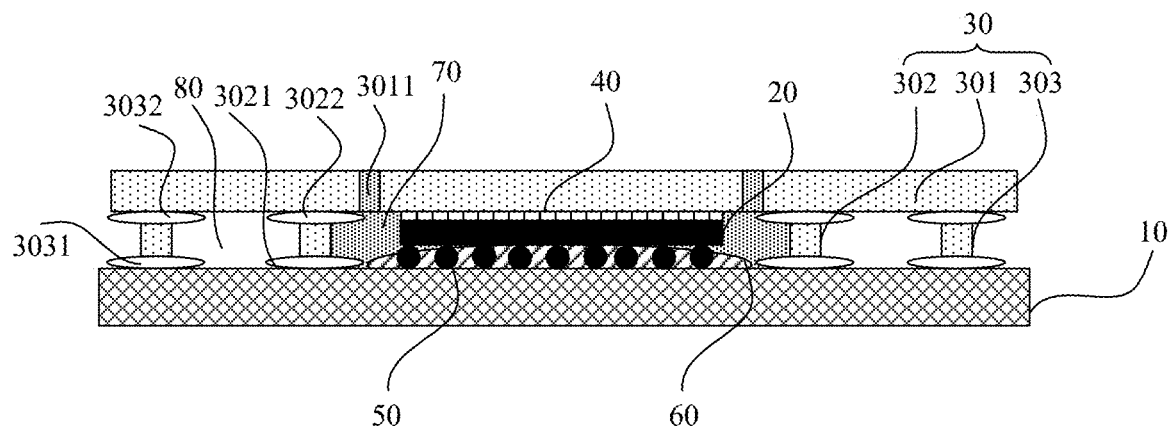
FIG. 5 is a sectional view of another packaged chip according to an embodiment of this application.

Refer to FIG. 5. In another implementation of this application, the first bracket 302, the second bracket 303, and the cover 301 are separately molded. For example, the first bracket 302 and the second bracket 303 each include a first end and a second end that are opposite to each other. For example, a first end of the first bracket 302 may be connected to the first surface of the substrate 10 by using a first bonding rubber ring 3021, and a second end of the first bracket 302 may be connected to the cover 301 by using a third bonding rubber ring 3022. For example, a first end of the second bracket 303 may be connected to the first surface of the substrate 10 by using a second bonding rubber ring 3031, and a second end of the second bracket 303 may be connected to the cover 301 by using a fourth bonding rubber ring 3032.

The first bonding rubber ring and the third bonding rubber ring 3022 are configured to seal the first space 70. The second bonding rubber ring 3031 and the fourth bonding rubber ring 3032 are configured to seal the second space 80.

For example, the first space 70 is a stable solid structure filled with the filling material inside, and the first bonding rubber ring 3021 and the third bonding rubber ring 3022 that are configured to seal the first space 70 may be complete annular structures.

The second space 80 is a hollow structure. To prevent air in the second space 80 from expanding or contracting with temperature changes to affect performance of the packaged chip, for example, an opening 3017 is provided on the second bonding rubber ring 3031 and the fourth bonding rubber ring 3032 that are configured to seal the second space 80. For example, the opening 3017 may be provided only on the second bonding rubber ring 3031 or the fourth bonding rubber ring 3032, or the opening 3017 may be provided on both the second bonding rubber ring 3031 and the fourth bonding rubber ring 3032. A person skilled in the art may determine a quantity, a size, and a location of openings as required. This is not limited in this application.

For a molding process of the first bonding rubber ring 3021 and the second bonding rubber ring 3031, refer to the foregoing descriptions. Details are not described herein again.

A specific molding process of the third bonding rubber ring 3022 and the fourth bonding rubber ring 3032 may be as follows: First, the bonding agent is applied to the second ends of the first bracket 302 and the second bracket 303. Then the cover 301 presses against the bonding agent. A bonding agent on the first bracket 302 is cured to form the third bonding rubber ring 3022. A bonding agent on the second bracket 303 is cured to form the fourth bonding rubber ring 3032.

Alternatively, the bonding agent may be applied to the cover 301 first. Then the bonding agent is attached to the second end of the first bracket 302 along with the cover 301 to form the third bonding rubber ring 3022, and is attached to the second end of the second bracket 303 to form the fourth bonding rubber ring 3032.

In this embodiment of this application, a rectangular annular structure is used as an example for the bonding rubber ring. Certainly, if the objective of this application can be achieved, the bonding rubber ring is not limited to the rectangular annular shape, and may be alternatively in a circular annular shape, an elliptical annular shape, a trapezoidal annular shape, or another shape. In this embodiment of this application, a shape and a size of the bonding rubber ring are the same as those of the bracket.

Figure 6:
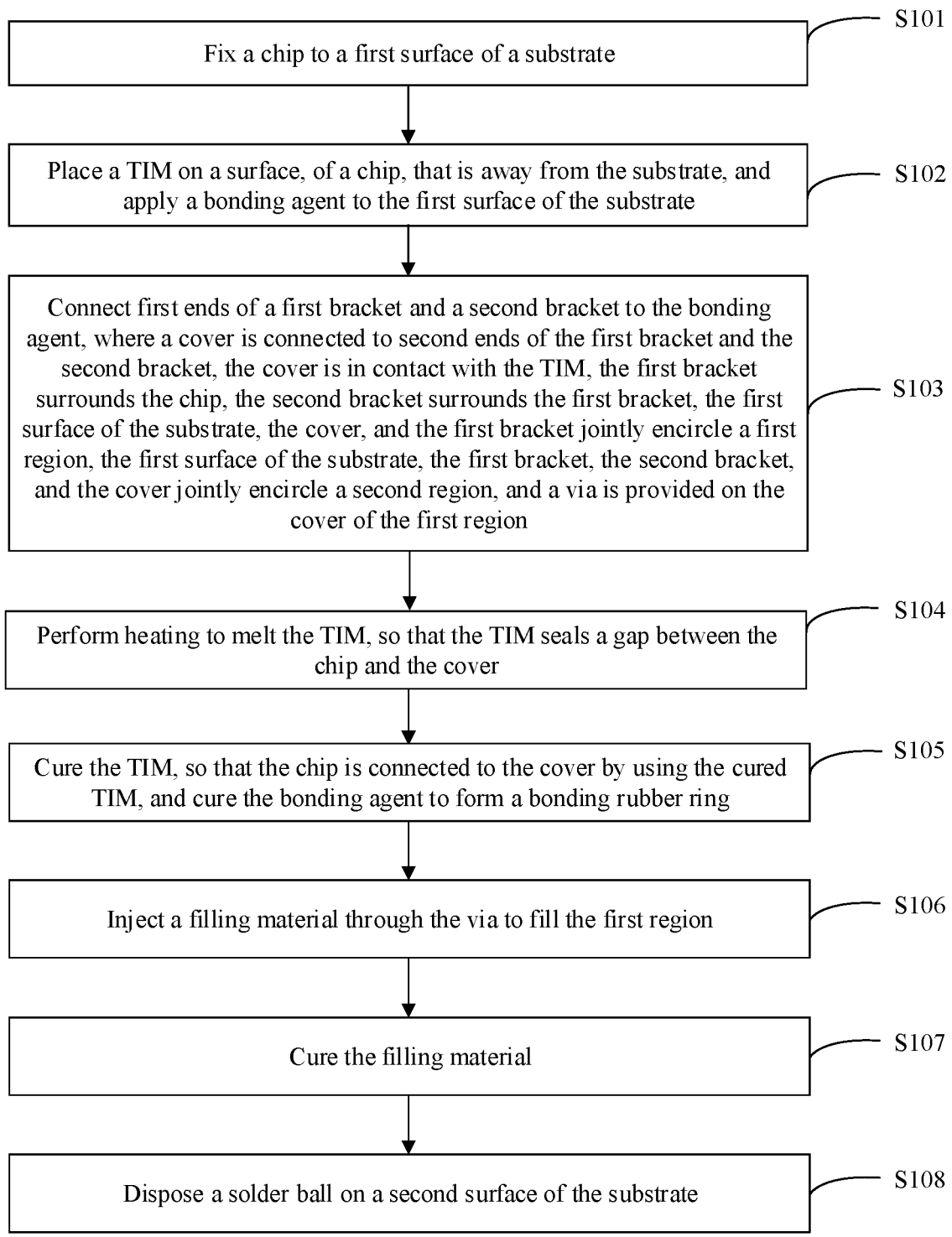
FIG. 6 is a flowchart of a method for manufacturing a packaged chip according to an embodiment of this application.

This application provides a method for manufacturing any one of the foregoing packaged chips. In the packaged chip, when a material of a TIM 40 is indium and a material of a filling material is silicone gel or polyolefin resin, as shown in FIG. 1, the method includes the following steps, as shown in FIG. 6.

Figure 7A:
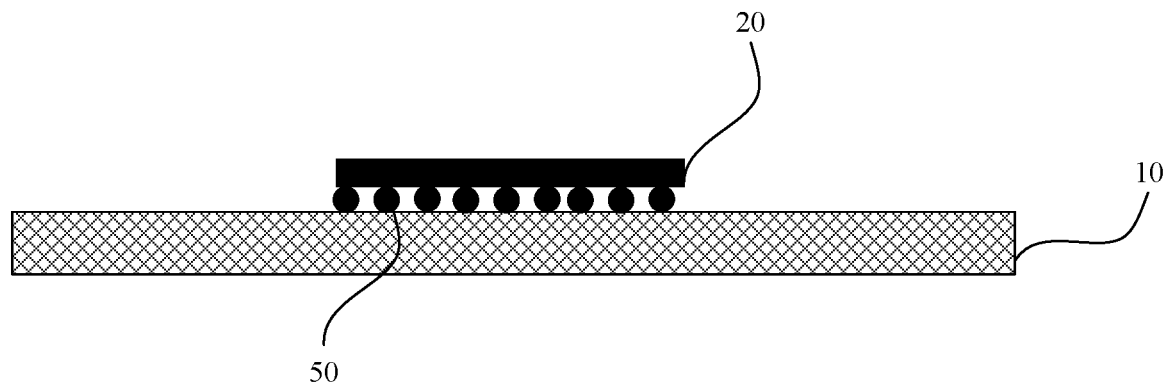
FIG. 7a, FIG. 7b, FIG. 7c, FIG. 7d, FIG. 7e, and FIG. 7f are schematic structural diagrams obtained respectively by performing manufacturing steps shown in FIG. 6.
Figure 7B:
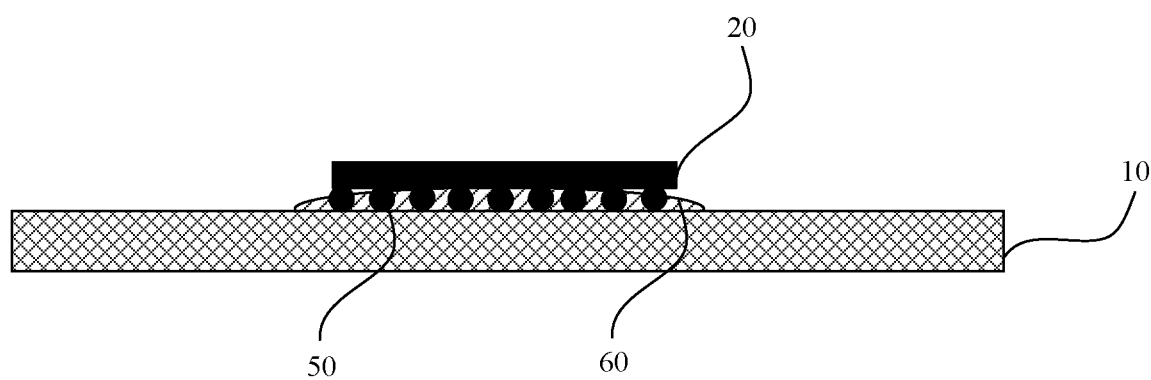

S101: As shown in FIG. 7a and FIG. 7b, fix a chip to a first surface of a substrate.

The fixing a chip 20 to a first surface of a substrate 10 includes: as shown in FIG. 7a, disposing a solder ball 50 on a first surface of the chip 20, and connecting the solder ball 50 to the first surface of the substrate 10 through reflow soldering; and as shown in FIG. 7b, injecting the filling material 60 into a gap between solder balls 50.

Figure 7C:
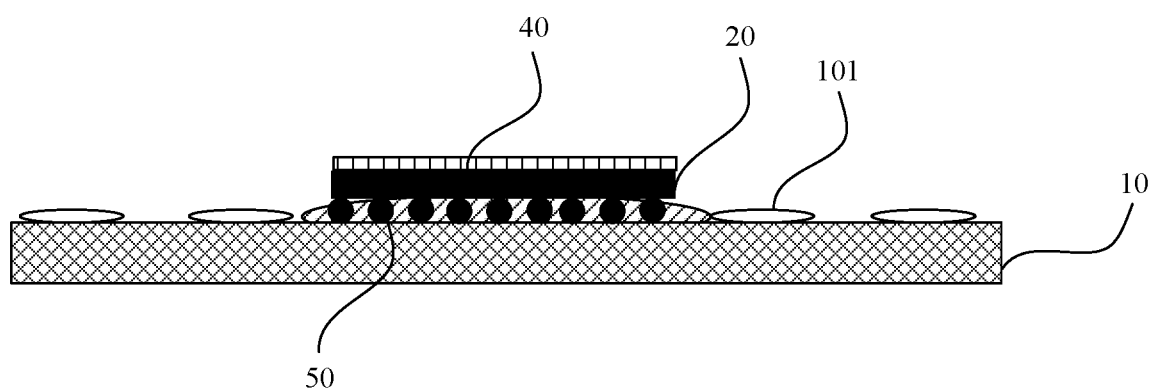

S102: As shown in FIG. 7c, place the TIM 40 on a surface, of the chip 20, that is away from the substrate 10, and apply a bonding agent 101 to the first surface of the substrate 10.

Figure 7D:
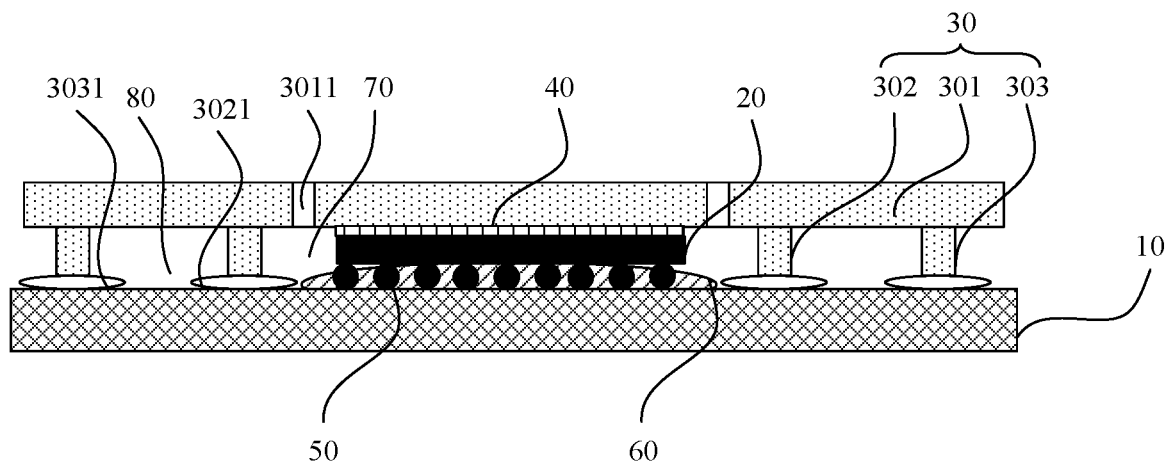

S103: As shown in FIG. 7d, separately connect first ends of a first bracket 302 and a second bracket 303 to the bonding agent, where a cover 301 is connected to second ends of the first bracket 302 and the second bracket 303, the cover 301 is in contact with the TIM 40, the first bracket 302 surrounds the chip 20, the second bracket 303 surrounds the first bracket 302, the first surface of the substrate 10, the cover 301, and the first bracket 302 jointly encircle a first space 70, and the chip 20 is accommodated in the first space 70. As shown in FIG. 3, the cover 301 includes a first cover 3012 opposite to the TIM 40, a second cover 3013 opposite to the first bracket 302, a fourth cover 3015 opposite to the second bracket 303, a third cover 3014 located between the first cover 3012 and the second cover 3013, and a fifth cover 3016 located between the second cover 3013 and the fourth cover 3015. A hole 3011 is provided on the third cover 3014.

In another implementation of this embodiment of this application, the bonding agent may be alternatively applied to the first ends of the first bracket 302 and the second bracket 303 first. Then the bonding agent is attached to the first surface of the substrate 10 along with the brackets.

S104: As shown in FIG. 7d, perform heating to melt the TIM 40, so that a first surface of the TIM 40 is connected to a second surface of the chip 20, and a second surface of the TIM 40 is connected to the cover 301.

S105: As shown in FIG. 7d, cure the TIM 40, so that the chip 20 is connected to the cover 301 by using the cured TIM 40, and cure the bonding agent to form a bonding rubber ring.

A bonding agent at a first end of the first bracket 302 is cured to form a first bonding rubber ring 3021. A bonding agent at a second end of the first bracket 302 is cured to form a third bonding rubber ring 3022. A bonding agent at a first end of the second bracket 303 is cured to form a second bonding rubber ring 3031. A bonding agent at a second end of the second bracket 303 is cured to form a fourth bonding rubber ring 3032.

The first bonding rubber ring 3021 and the third bonding rubber ring 3022 are configured to seal the first space 70. The second bonding rubber ring 3031 and the fourth bonding rubber ring 3032 are configured to seal a second space 80.

For example, the first bonding rubber ring 3021 and the third bonding rubber ring 3022 are complete annular structures, and an opening is provided on the second bonding rubber ring 3031 and the fourth bonding rubber ring 3032 for connecting to an external environment.

Figure 7E:
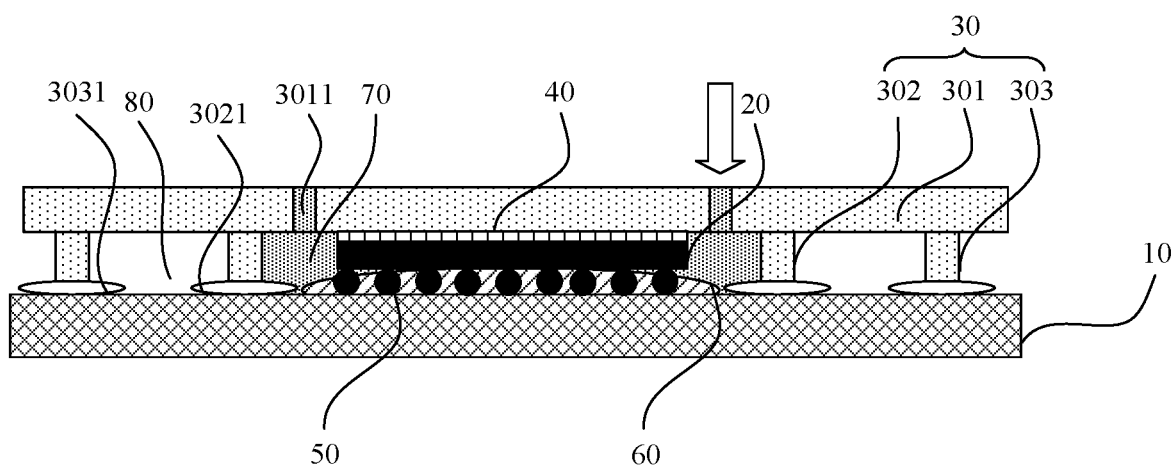

S106: As shown in FIG. 7e, inject the filling material through the hole 3011, where the filling material is adjacent to side surfaces of the chip 20 and the TIM 40, and fills the first space 70.

S107: As shown in FIG. 7e, cure the filling material.

Figure 7F:
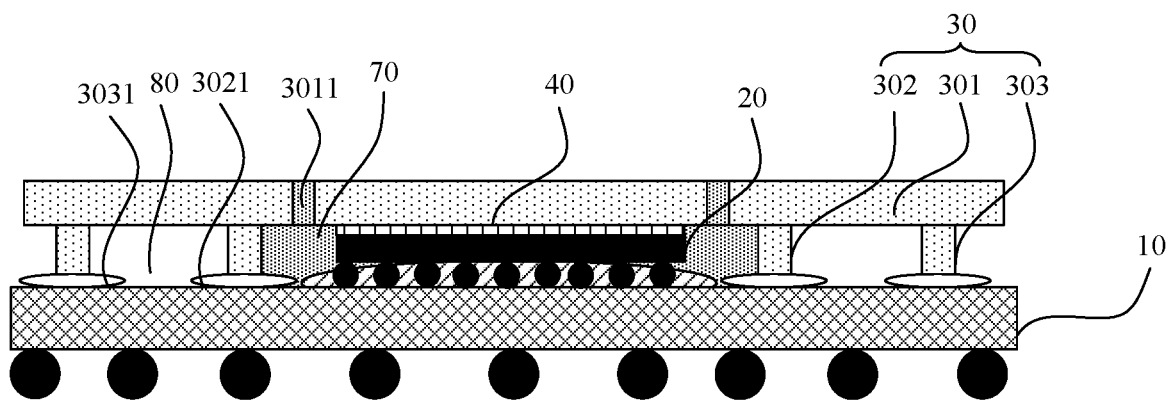

S108: As shown in FIG. 7f, dispose a solder ball on a second surface of the substrate 10.

After the chip 20 is packaged, for example, the solder ball may be disposed on the second surface of the substrate 10, and the solder ball is connected to a first surface of a circuit board through reflow soldering.

It should be noted that a sequence of the foregoing steps is not limited in this application, and the sequence of the foregoing steps may be adjusted based on different manufacturing processes. For example, the injecting the filling material into the gap between solder balls of the chip 20 shown in FIG. 7b when the chip 20 is fixed to the first surface of the substrate 10 in step S101 may be performed before step S107. In this case, different materials may be used for the filling material configured to fill the gap between solder balls and the filling material configured to fill the first space 70.

Alternatively, for another example, step S102 may be combined with step S107. To be specific, the filling material is injected into the first space 70 and the gap between solder balls of the chip 20 at the same time. In this case, a same material is used for the filling material configured to fill the gap between solder balls and the filling material configured to fill the first space 70.

Figure 8:
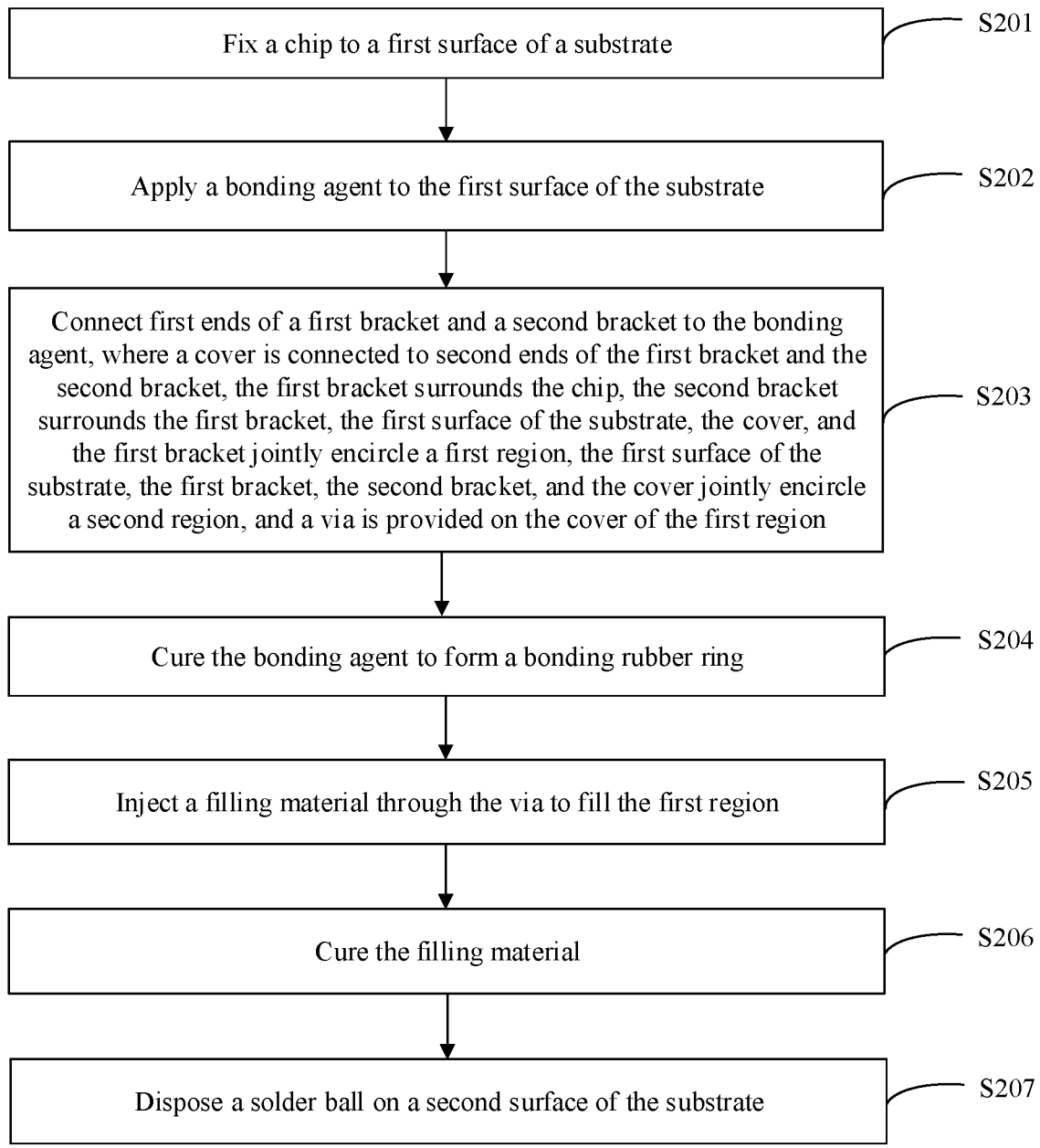
FIG. 8 is a flowchart of another method for manufacturing a packaged chip according to an embodiment of this application.

In addition, this application further provides a method for manufacturing any one of the foregoing packaged chips. When both the TIM and the filling material in the packaged chip are silicone gel materials, as shown in FIG. 8, the method includes the following steps.

Figure 9A:
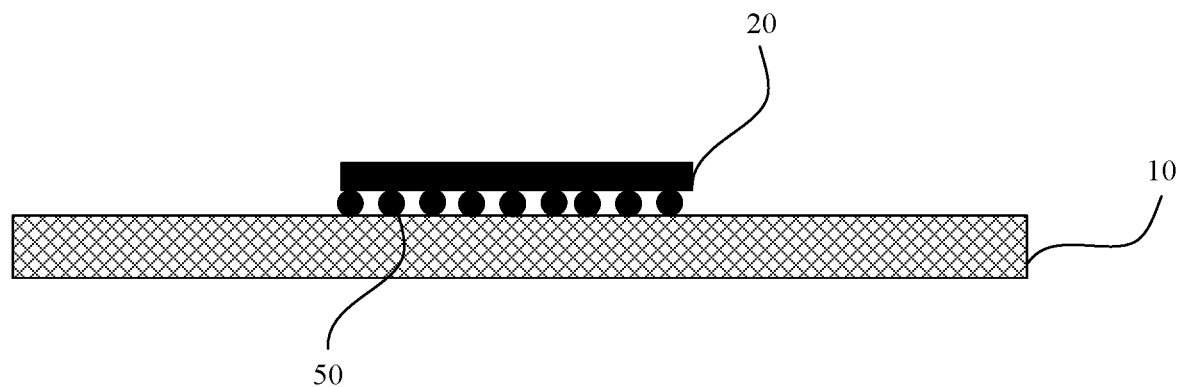
FIG. 9a, FIG. 9b, FIG. 9c, FIG. 9d, FIG. 9e, and FIG. 9f are schematic structural diagrams obtained respectively by performing manufacturing steps shown in FIG. 8.
Figure 9B:
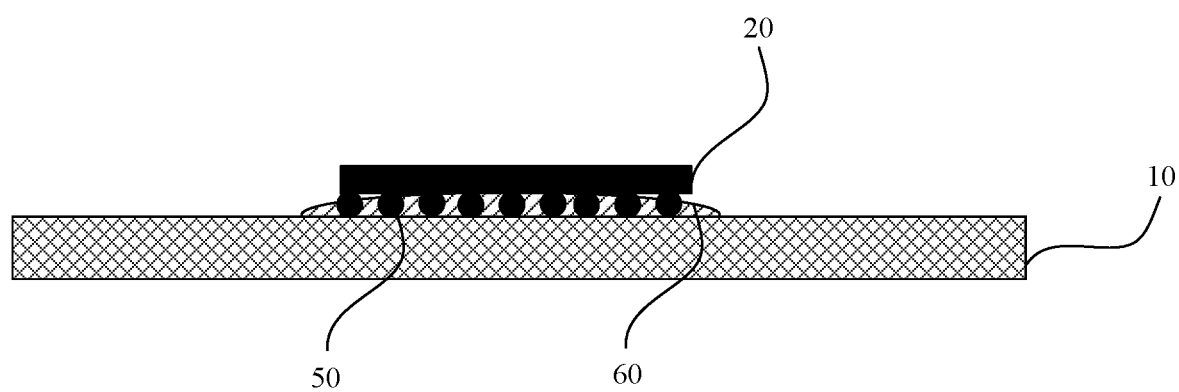

S201: As shown in FIG. 9a and FIG. 9b, fix a chip 20 to a first surface of a substrate 10.

The fixing a chip 20 to a first surface of a substrate 10 includes: disposing a solder ball on a first surface of the chip 20, and connecting the solder ball to the first surface of the substrate 10 through reflow soldering; and as shown in FIG. 9b, injecting the filling material into a gap between the first surface of the chip 20 and the first surface of the substrate 10.

Figure 9C:
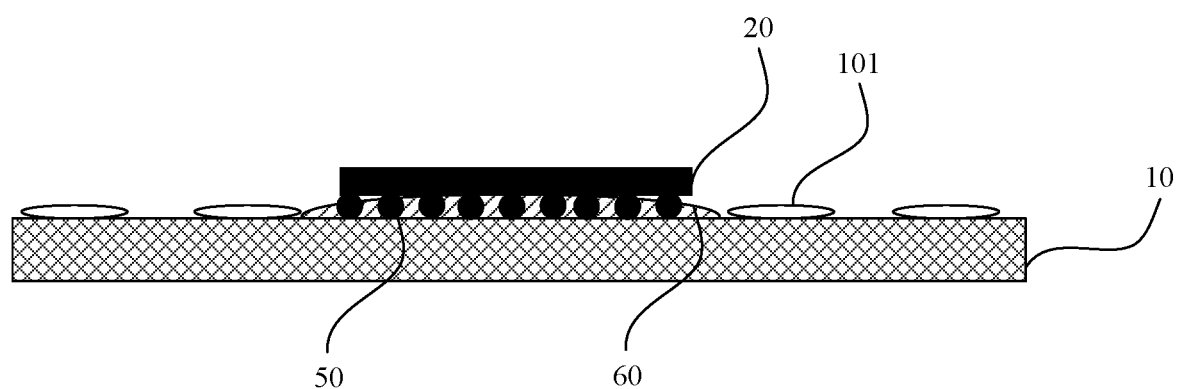

S202: As shown in FIG. 9c, apply a bonding agent to the first surface of the substrate 10.

Figure 9D:
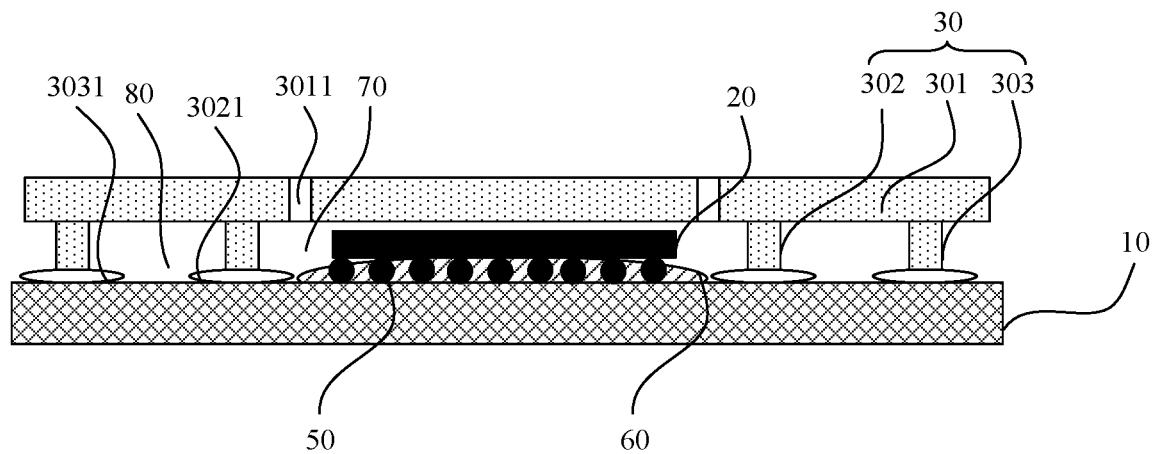

S203: As shown in FIG. 9d, separately connect first ends of a first bracket 302 and a second bracket 303 to the bonding agent, where a cover 301 is connected to second ends of the first bracket 302 and the second bracket 303, the first bracket 302 surrounds the chip 20, the second bracket 303 surrounds the first bracket 302, the first surface of the substrate 10, the cover 301, and the first bracket 302 jointly encircle a first space 70, and the chip 20 is accommodated in the first space 70. As shown in FIGS. 3 and 4, the cover 301 includes a first cover 3012 opposite to the TIM 40, a second cover 3013 opposite to the first bracket 302, a fourth cover 3015 opposite to the second bracket 303, a third cover 3014 located between the first cover 3012 and the second cover 3013, and a fifth cover 3016 located between the second cover 3013 and the fourth cover 3015. A hole 3011 is provided on the third cover 3014.

S204: As shown in FIG. 9d, cure the bonding agent to form a bonding rubber ring.

Figure 9E:
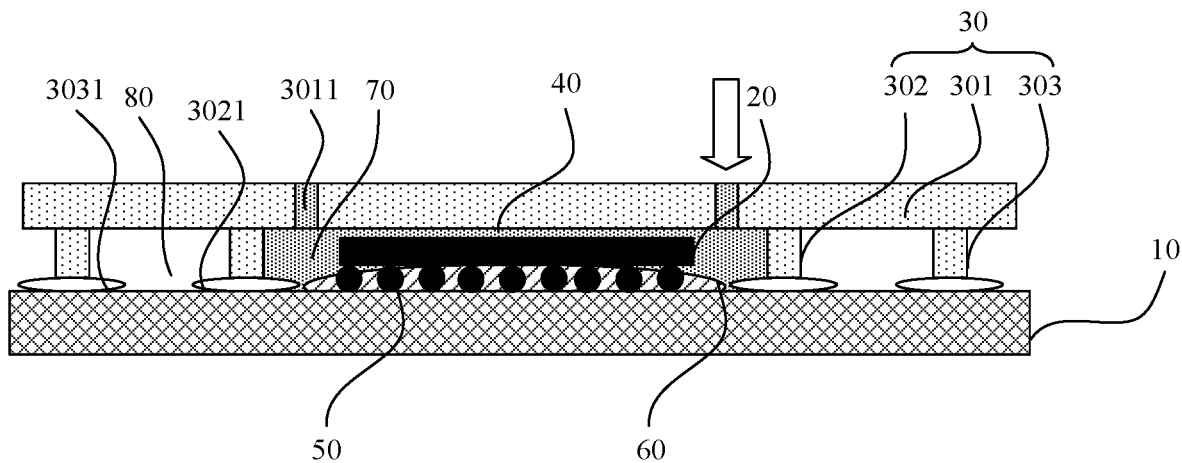

S205: As shown in FIG. 9e, inject the filling material through the hole 3011, where the filling material is adjacent to side surfaces of the chip 20 and the TIM 40, and fills the first space 70.

S206: As shown in FIG. 9e, cure the filling material.

Figure 9F:
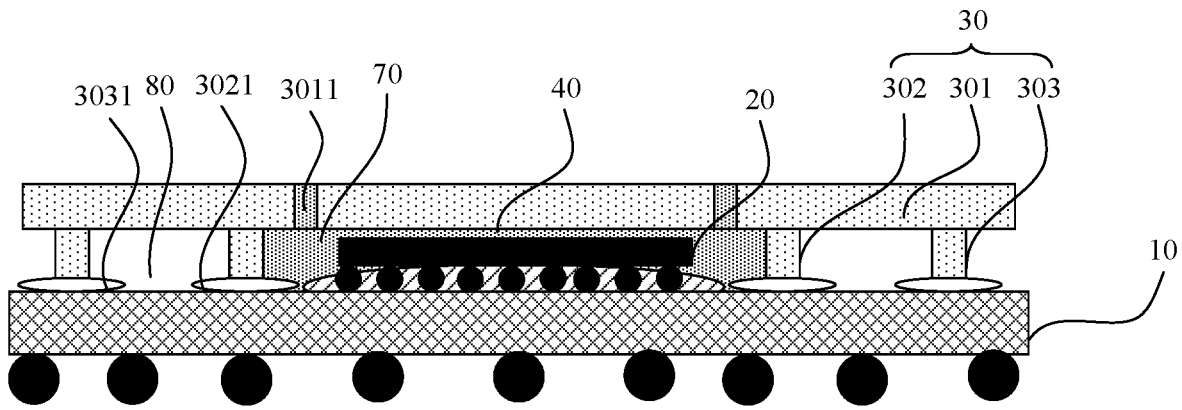

S207: As shown in FIG. 9f, dispose a solder ball on a second surface of the substrate 10.

After the chip 20 is packaged, for example, the solder ball may be disposed on the second surface of the substrate 10, and the solder ball is connected to a first surface of a circuit board through reflow soldering.

For example, that a cover 301 is connected to second ends of the first bracket 302 and the second bracket 303 in step S103 and step S203 includes: The first bracket 302 and the second bracket 303 may be integrally molded with the cover 301; or the first bracket 302 and the second bracket 303 may be fastened to the cover 301 by using a bonding rubber ring.

If the first bracket 302 and the second bracket 303 are integrally molded with the cover 301, the first bracket 302, the second bracket 303, and the substrate 10 may be treated as a whole, and only the first ends of the first bracket 302 and the second bracket 303 need to be fastened to the first surface of the substrate 10.

Figure 10:
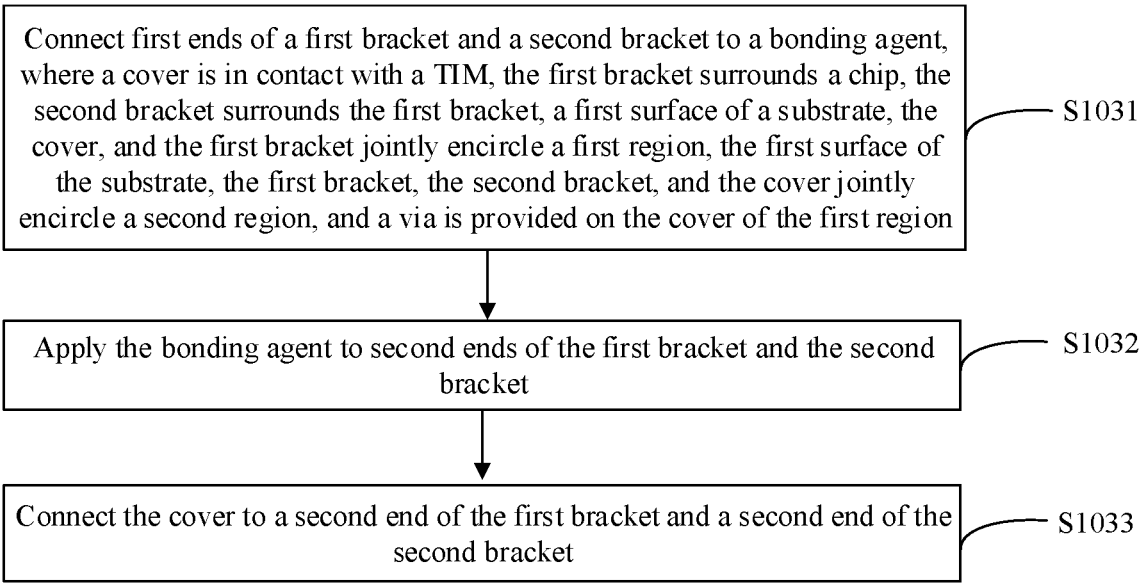
FIG. 10 is a flowchart of another method for manufacturing a packaged chip according to an embodiment of this application.

If the first bracket 302 and the second bracket 303 are fastened to the cover 301 by using the bonding rubber ring, as shown in FIG. 10, the method for manufacturing the packaged chip further includes the following steps.

Figure 11A:
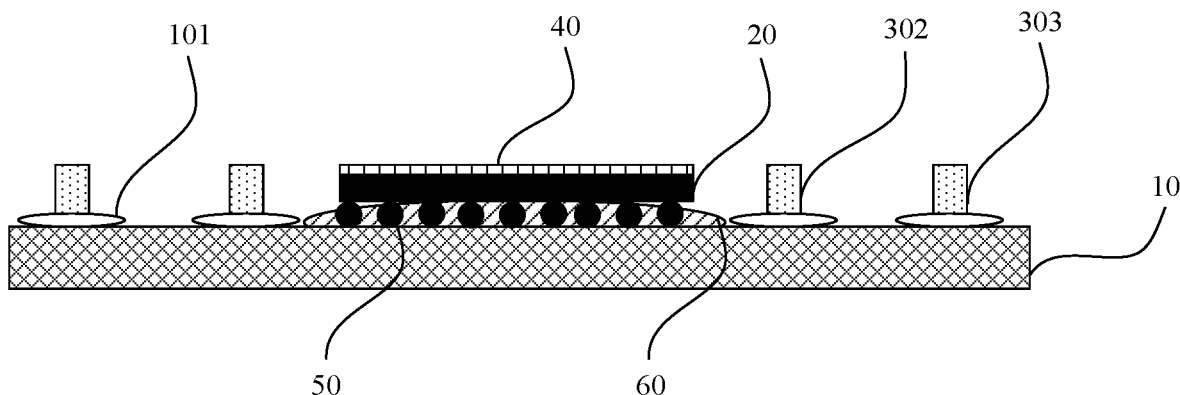
FIG. 11a, FIG. 11b, and FIG. 11c are schematic structural diagrams obtained respectively by performing manufacturing steps shown in FIG. 10.

S1031: As shown in FIG. 11a, connect the first ends of the first bracket and the second bracket to the bonding agent 101, where the cover is in contact with the TIM, the first bracket surrounds the chip, the second bracket surrounds the first bracket, the first surface of the substrate, the cover, and the first bracket jointly encircle the first space, the first surface of the substrate, the first bracket, the second bracket, and the cover jointly encircle the second space, and a hole is provided on the cover of the first space.

Figure 11B:
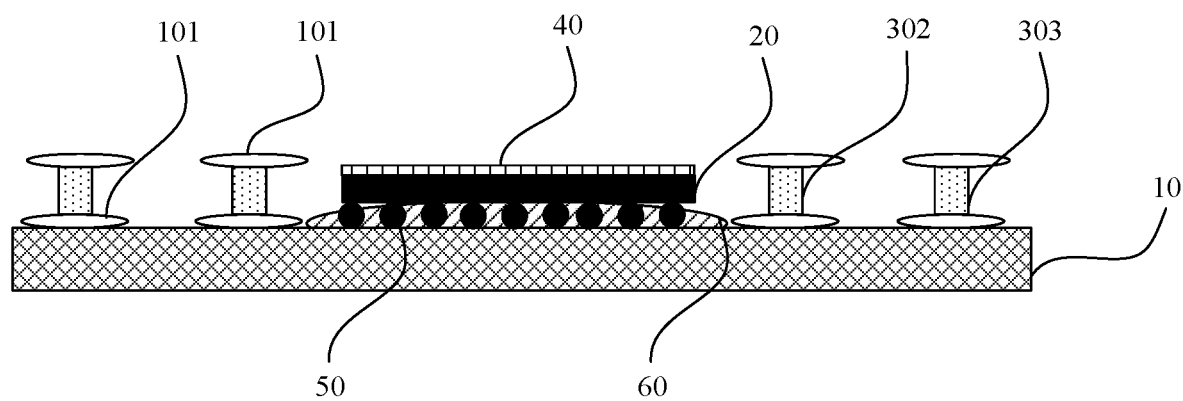

S1032: As shown in FIG. 11b, apply the bonding agent 101 to the second ends of the first bracket 302 and the second bracket 303.

Figure 11C:
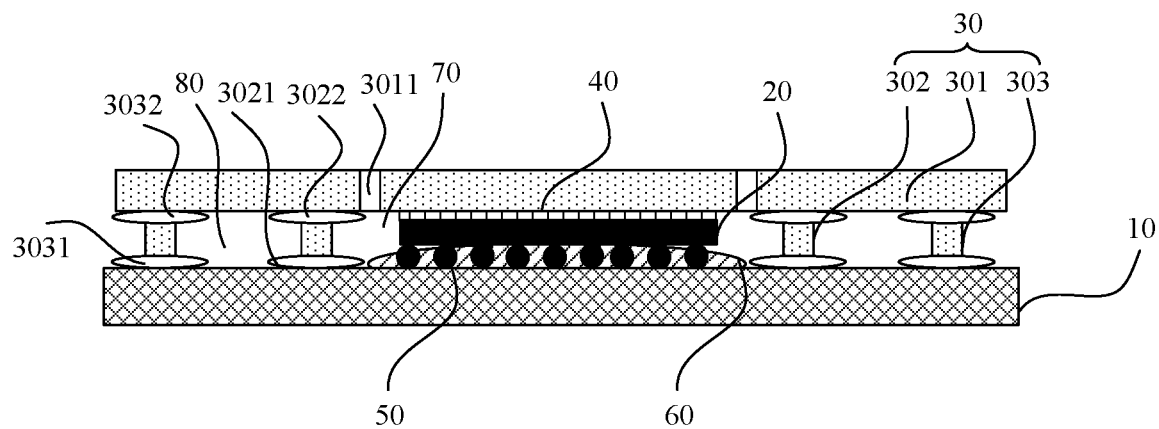

S1033: As shown in FIG. 11c, connect the cover 301 to the second ends of the first bracket 302 and the second bracket 303.

In another implementation of this embodiment of this application, the bonding agent may be alternatively applied to the cover 301 first. Then the bonding agent is attached to the second ends of the first bracket 302 and the second bracket 303 along with the cover 301.

The method for manufacturing a packaged chip in this embodiment of this application has a same technical effect as that of the packaged structure of the chip 20 provided in the foregoing embodiments. Details are not described herein again.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A packaged chip comprising:
a substrate,
a chip, and
a heat sink,
wherein:
the heat sink comprises a first bracket, a second bracket, and a cover, wherein the first bracket and the second bracket are disposed on the substrate, and the cover is supported on the substrate by the first bracket and the second bracket;

the first bracket is a sealed annular bracket, wherein the first bracket and the cover encircle a first space, the chip is accommodated in the first space, and a thermal interface material is disposed between the chip and the cover;

a hole connected to the first space is provided on the cover, wherein the hole and the first space are filled with a filling material; and the second bracket is located outside the first space, wherein the second bracket is an annular bracket disposed along a periphery of the substrate, wherein the second bracket is disposed around the first bracket and the chip, wherein a second space is formed by joining together the substrate, the second bracket, the first bracket, and the cover;

wherein an opening in the second space is provided on a bonding material layer between an adjoining of edge of the second bracket and a surface of the substrate, and wherein the opening is configured to allow air flow in and out of the second space.

2. The packaged chip according to claim 1, wherein the first bracket and the second bracket are integrally molded with the cover, and the first bracket and the second bracket are separately connected to the substrate by using a bonding material.

3. The packaged chip according to claim 1, wherein first ends of the first bracket and the second bracket are separately connected to the substrate by using a bonding material, and second ends of the first bracket and the second bracket are separately connected to the cover by using a bonding material.

4. The packaged chip according to claim 1, wherein the second bracket comprises two or more support parts, and the two or more support parts are evenly arranged along a periphery of the substrate.

5. The packaged chip according to claim 1, wherein materials of the thermal interface material and the filling material are both silicone gel, or materials of the thermal interface material and the filling material are both polyolefin resin, and the thermal interface material and the filling material are integrally molded through injection molding.

6. The packaged chip according to claim 5, wherein the cover comprises a first cover opposite to the chip, a second cover opposite to the first bracket, and a third cover located between the first cover and the second cover, the hole is located on the first cover or the third cover, and the filling material is injected into the first space through the hole.

7. The packaged chip according to claim 1, wherein a material of the thermal interface material is indium, a material of the filling material is silicone gel or polyolefin resin, and the filling material is molded through injection molding after the thermal interface material is molded.

8. The packaged chip according to claim 7, wherein the cover comprises a first cover opposite to the chip, a second cover opposite to the first bracket, and a third cover located between the first cover and the second cover, the hole is located on the third cover, and the filling material is injected into the first space through the hole.

* * * * *